(12) United States Patent
Tichauer et al.

(10) Patent No.: US 6,600,241 B2
(45) Date of Patent: Jul. 29, 2003

(54) METHOD AND APPARATUS FOR COMPENSATING FOR IONIZING RADIATION INDUCED THRESHOLD SHIFT IN METAL OXIDE SEMICONDUCTOR FIELD EFFECT TRANSISTORS

(75) Inventors: Larry M. Tichauer, La Palma, CA (US); Steven S. McClure, La Crescenta, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 10/226,381

(22) Filed: Aug. 23, 2002

(65) Prior Publication Data

US 2003/0042513 A1 Mar. 6, 2003

Related U.S. Application Data

(62) Division of application No. 09/332,599, filed on Jun. 14, 1999, now Pat. No. 6,509,589.

(51) Int. Cl.[7] .................................. H05B 37/02
(52) U.S. Cl. ...................... 307/117; 307/297; 307/308; 307/304; 307/307
(58) Field of Search .................................. 307/304, 308, 307/297, 117

(56) References Cited

U.S. PATENT DOCUMENTS 4,011,471 A * 3/1977 Rockett, Jr.

* cited by examiner

Primary Examiner—Fetsum Abraham
(74) Attorney, Agent, or Firm—Terje Gudmestad

(57) ABSTRACT

A compensation circuit and method for compensating for the threshold shift in an irradiated MOSFET. The method determines the gate threshold voltage to body voltage relationship to vary the body voltage with radiation. The compensation circuit (10) has at least one MOSFET (Q2) having the same channel type as the MOSFET being compensated (Q1). The at least one matching MOSFET (Q2) is connected to the gate of the MOSFET (Q1) being compensated. At least one MOSFET (Q3, Q4) having a channel type that is different from the channel type of the MOSFET (Q1) being compensated is connected to the gate of the matching MOSFET (Q2). The result is that the compensation circuit (10) controls a negative shift in the body voltage of the MOSFET (Q1) being compensated resulting in a higher threshold voltage.

4 Claims, 2 Drawing Sheets

METHOD AND APPARATUS FOR COMPENSATING FOR IONIZING RADIATION INDUCED THRESHOLD SHIFT IN METAL OXIDE SEMICONDUCTOR FIELD EFFECT TRANSISTORS

This application is a Divisional of application No. 09,332,599 filed Jun. 14, 1999 now U.S. Pat. No. 6,509,589.

TECHNICAL FIELD

The present invention relates to radiation tolerant metal oxide semiconductor field effect transistors (MOSFET's) and more particularly to a method for compensating for the ionizing radiation induced threshold shift in MOSFET's within MOS integrated circuits.

BACKGROUND ART

The MOS device is the heart of present day electronics and MOSFET's are widely used in commercial space applications where they are exposed to radiation. The harsh radiation causes a build up of trapped electric charge in the oxide, which causes a shift in the transistor gate threshold voltage, resulting in a failure of the device.

Radiation tolerant MOSFET's have been proposed to address this problem. However, the process used to fabricate radiation tolerant integrated circuits (IC's) differs substantially from standard fabrication processes. As a result of the highly specialized fabrication process, radiation tolerant IC's are extremely costly.

SUMMARY OF THE INVENTION

The present invention is a method for making a radiation tolerant MOSFET using standard MOSFET integrated devices. The method offsets the threshold shift by way of a compensation circuit built into the design of the MOS integrated circuit. The gate threshold voltage has been found to be a function of the body threshold voltage. The compensation circuit adjusts the body voltage of a transistor in the active circuit by using the threshold shift of other transistors in the compensation circuit, on the same integrated circuit.

The radiation induced threshold shift in a first transistor is compensated by using the radiation induced threshold shift in a second transistor, or a network of transistors, to shift the body voltage of the first transistor, thereby significantly improving the radiation tolerance of the first transistor.

The method of the present invention produces a radiation tolerant MOS device that can be produced using any available commercial process, without the need for special fabrication. The result is a significant cost reduction for radiation tolerant MOS IC's because they can be produced using IC fabrication processes that are readily available.

It is an object of the present invention to improve the radiation tolerance of MOSFET's. It is another object of the present invention to produce a radiation tolerant MOSFET without the need for highly specialized, expensive fabrication.

It is a further object of the present invention to provide a compensation circuit to offset the threshold voltage shift induced by radiation. It is yet a further object of the present invention to design the compensation circuit based on the gate threshold voltage as a function of the body voltage of the MOSFET.

Other objects and features of the present invention will become apparent when viewed in light of the detailed description of the preferred embodiment when taken in conjunction with the attached drawings and appended claims.

BEST MODE(S) FOR CARRYING OUT THE INVENTION

Figure 1:
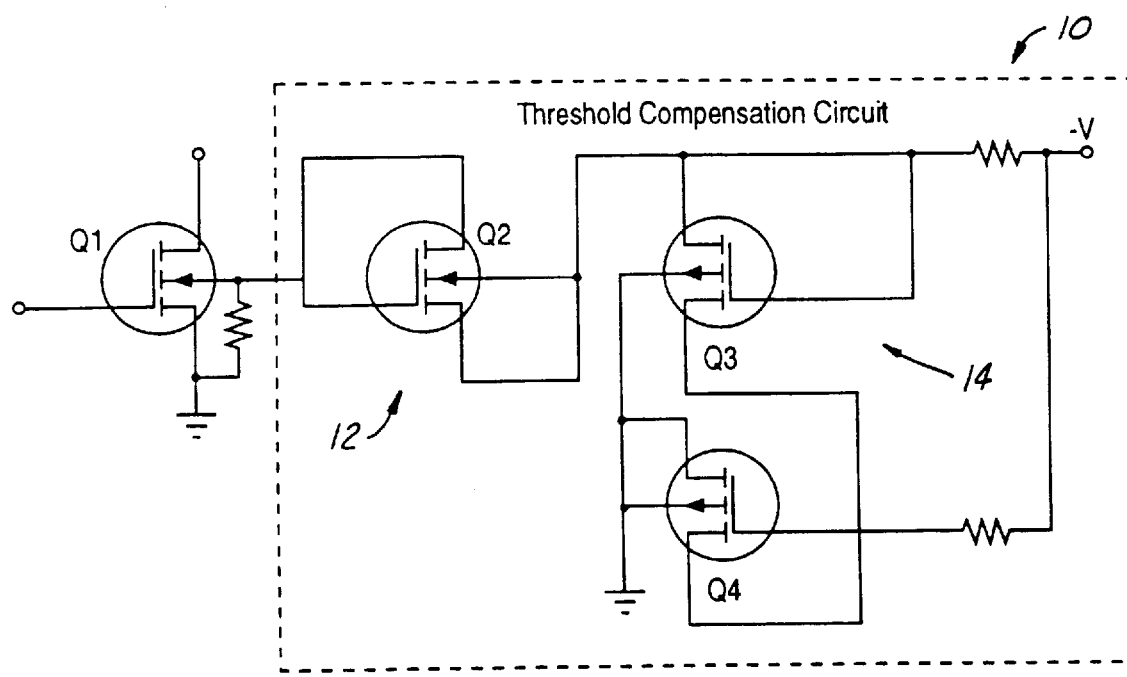
FIG. 1 is a schematic of the threshold shift compensation circuit of the present invention.

A schematic diagram of a threshold compensation circuit 10 of the present invention is shown in FIG. 1. Q1 is an N-Channel MOSFET whose radiation tolerance is being improved by the threshold compensation circuit 10. The threshold compensation circuit 10 is comprised of at least two transistors. In the present example, three transistors Q2, Q3, and Q4 are shown. For threshold compensation of the N-Channel MOSFET Q1, the compensation circuit includes at least one N-Channel MOSFET and at least one P-Channel MOSFET. In the present example, Q2 is an N-Channel MOSFET. Q3 and Q4 are P-Channel MOSFET's. While the present invention is being described herein with reference to compensating an N-Channel device, it should be noted that it is possible to apply the present invention to devices other than N-Channel.

In general, for compensation of a MOSFET there are two "columns", 12 and 14, associated with the compensation circuit. More than one MOSFET can be used in the "column" 12 adjacent the MOSFET being compensated. The type of MOSFET(s) in this column will match the type of MOSFET being compensated, i.e. all MOSFETS are of the N-Channel type.

More than one MOSFET can be used in the "column" 14 adjacent the "column" 12, and this MOSFET type will be different from the type being compensated. For example, the compensation circuit for an N-Channel MOSFET will have at least one N-Channel MOSFET in the "column" 12 adjacent the MOSFET being compensated, and at least one P-Channel MOSFET in the adjacent "column" 14.

The compensation circuit 10 is used to maintain the threshold voltage for Q1 to an acceptable level. The threshold voltage depends on the substrate bias sensitivity, VBS, also known as the substrate to source voltage, or body to source voltage. Any adjustment in the body voltage of Q1 will result in a positive shift in the gate threshold voltage of Q1. For the circuit shown in FIG. 1, the body voltage (VBS) for transistor Q1 is:

$$VBS_{Q1} = VGS(th)_{Q2} + VGS(th)_{Q3} VGS(th)_{Q4}$$

where VGS(th) is the threshold voltage for each of the transistors Q2 through Q4.

Transistors Q3 and Q4 control the voltage applied to the source of Q2. Q2 keeps the body voltage of Q1 near 0 Volts prior to irradiation. As the circuit is irradiated, the combined threshold shifts of Q3 and Q4 force the body voltage of Q1 to go negative with respect to the source of Q1.

For a constant body voltage, the threshold voltage of Q1 would tend to shift negative with irradiation. However, the negative shift in body voltage controlled by the compensation circuit cause the channel of Q1 to appear more negative and thereby require a more positive voltage to be applied to the gate to turn on Q1.

Figure 2:
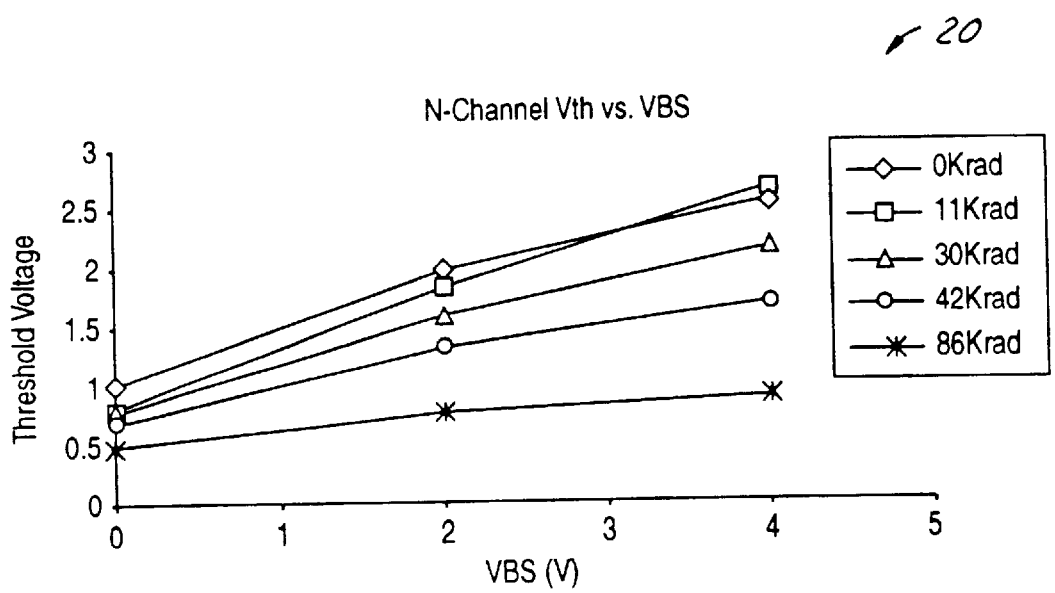
FIG. 2 is a graph of the threshold voltage as a function of body to source voltage.

FIG. 2 is a graph of the threshold shift data 20 for a transistor element on a MOS process from a commercial foundry. The gate threshold voltage of the MOS transistor is a function of the body to source voltage. Adjusting the body voltage results in a positive shift in the gate threshold. Each plot on the graph represents a different level of radiation.

Figure 3:
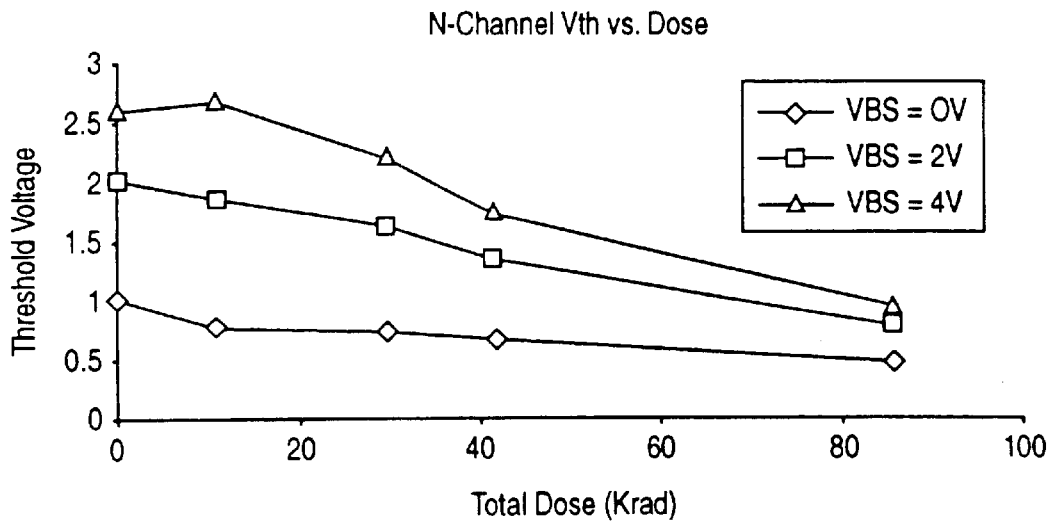
FIG. 3 is a graph of the threshold voltage for an N-Channel MOSFET at varying radiation doses.

FIG. 3 is the threshold voltage shift (30) for an uncompensated N-Channel device as it undergoes radiation. The threshold voltage decreases as the total dose of radiation increases. The threshold voltage falls below 0.5 Volts at around 80 Krad, which is an unacceptably low threshold margin.

Figure 4:
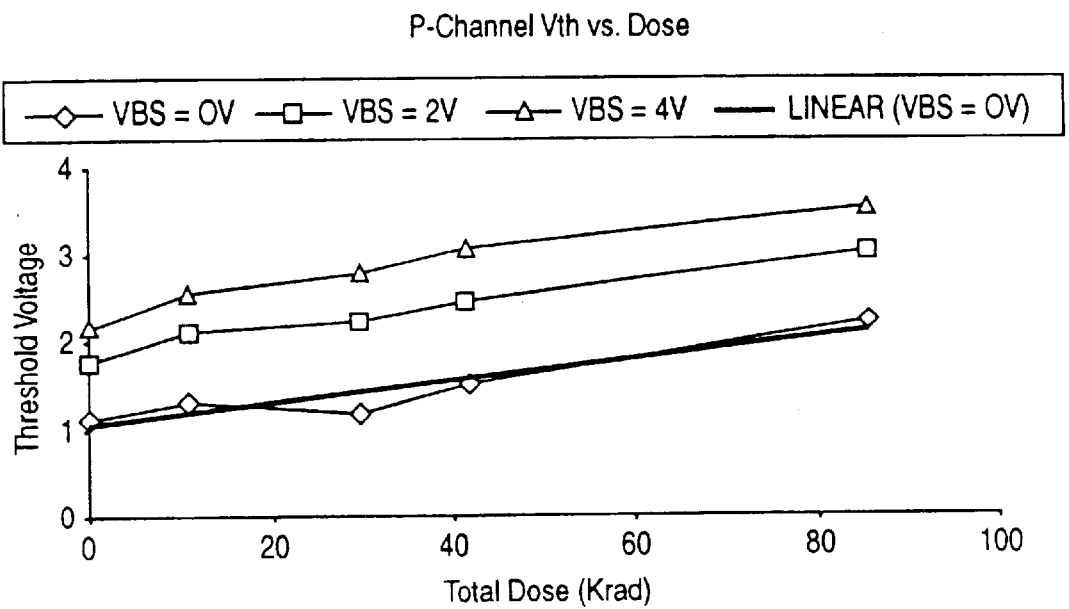
FIG. 4 is a graph of the threshold voltage for a P-Channel MOSFET at varying radiation doses.

FIG. 4 is the threshold voltage shift for an uncompensated P-Channel device (also from a commercial foundry) as it undergoes radiation. The threshold voltage increases as the total dose of radiation increases.

Using the compensation circuit (10) in FIG. 1, a combination of the N-Channel and P-Channel devices in the compensation circuit (10) allow the threshold voltage for Q1 to be maintained at an acceptable level. When the circuit (10) is exposed to radiation, it is expected to shift the body voltage of the MOSFET Q1 in a predetermined manner. A negative shift in the body voltage of Q1 results in a positive shift in the threshold voltage of Q1. The following table summarizes test results of individual transistor elements and the effect of the compensation circuit 10 on an N-Channel device in comparison to an uncompensated N-Channel device.

| Total Dose | VBSQ1 | Compensated Threshold Voltage | Uncompensated Threshold Voltage |
|---|---|---|---|
| 0 | −1.0 | 1.5 | 1.0 |
| 20 | −1.7 | 1.6 | 0.75 |
| 40 | −2.3 | 1.4 | 0.7 |
| 60 | −2.9 | 1.3 | 0.6 |
| 80 | −3.6 | 1.0 | 0.5 |

Clearly from the data in the table, the threshold voltage for the compensated MOSFET is well above 0.5 Volts, even at 80 Krad. The compensation circuit may be used for much higher dose levels, and is limited only by the supply voltage range.

While particular embodiments of the invention have been shown and described, numerous variations and alternate embodiments will occur to those skilled in the art. Accordingly, it is intended that the invention be limited only in terms of the appended claims.

What is claimed is:

1. A method for improving the radiation tolerance of a MOSFET comprising the steps of:

determining the gate threshold voltage to body voltage relationship for a MOSFET;

implementing a compensation circuit to make a negative adjustment of the body voltage with radiation.

2. The method as claimed in claim 1 wherein said step of implementing further comprises implementing a combination of N-Channel and P-Channel MOSFETS such that a threshold voltage drift in said MOSFET is compensated.

3. The method as claimed in claim 2 wherein said step of implementing further comprises:

connecting at least one MOSFET to the gate of said MOSFET to be compensated, said at least one MOSFET and said MOSFET to be compensated having the same channel type; and connecting at least one MOSFET to a gate of said at least one matching MOSFET, said at least one MOSFET and said matching MOSFET being different channel types.

4. The method as claimed in claim 2 further comprising the step of determining dimension of said at least one matching MOSFET and said at least one different MOSFET based on radiation characterization data in order to provide optimum threshold shift compensation.

* * * * *